(12) United States Patent
Nakajima et al.

(10) Patent No.: US 6,535,569 B2
(45) Date of Patent: Mar. 18, 2003

(54) SYNCHRONOUS COUNTER

(75) Inventors: Masami Nakajima, Tokyo (JP); Hiroyuki Kondo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/756,129

(22) Filed: Jan. 9, 2001

(65) Prior Publication Data

US 2002/0015467 A1 Feb. 7, 2002

(30) Foreign Application Priority Data

Jul. 3, 2000 (JP) ........................................ 2000-201401

(51) Int. Cl.⁷ .............................................. H03K 23/54
(52) U.S. Cl. ........................................ 377/122; 377/116
(58) Field of Search ................................. 377/122, 116

(56) References Cited

U.S. PATENT DOCUMENTS 5,289,518 A * 2/1994 Nakao ........................ 377/81
5,754,615 A * 5/1998 Colavin ....................... 377/47
6,091,794 A * 7/2000 Rogers ....................... 377/116

OTHER PUBLICATIONS

"VLSI General Encyclopedia (VLSI Sogoo Jiten)", issued by Science Forum, Mar. 31, 1988, p. 844, (including an English Language Translation).

* cited by examiner

Primary Examiner—Margaret R. Wambach
(74) Attorney, Agent, or Firm—Burns, Doane, Swecker & Mathis, LLP

(57) ABSTRACT

A synchronous counter includes at least three or more flip-flops having a chain structure, and at least two or more 2-input EXOR gates interposed in the chain structure. The number of stages of gates interposed between the output of one among the flip-flops and the input of another is one stage of a 2-input EXOR gate even in a critical path thereby shortening the critical path.

4 Claims, 3 Drawing Sheets

SYNCHRONOUS COUNTER

BACKGROUND OF THE INVENTION

1. Field of the Invention

The present invention relates to a synchronous counter for use in a semiconductor integrated circuit such as MOS memory.

2. Description of the Prior Art

FIG. 4 is a circuit diagram illustrating a binary counter of a typical counter, and FIG. 5 is a circuit diagram illustrating a conventional synchronous counter using an LFSR. In FIGS. 4 and 5, F1–F8, F9–F16 each denote a flip-flop; E1–E7, E8–E10 each denote an exclusive OR circuit or EXOR gate; A1–A6 each denote an AND gate; and N1 denotes a NOT gate.

Here, a counter is constructed by n flip-flops (n: natural number), which repeat ON/OFF operations appropriately and come back to a primary status in a constant cycle. Though the n flip-flops take $2^n$ states (n-th power of 2, $n \geq 0$) at the maximum, a counter using the whole $2^n$ states is a filled code counter, while a counter not using the $2^n$ states all is an unfilled code counter. A representative of the filled code counter is a binary counter.

On the other hand, there is another classification for counters. That is, a counter provided with n flip-flops each having a class is a weighting counter, while a counter not having a class is a nonweighting counter. It is apparent that the binary counter belongs to the weighting counter, while a representative of the nonweighting counter is a Johnson counter.

An example of the nonweighting counter that takes $2^n-1$ states and is infinitely in proximity with the filled code counter is an LFSR (Linear Feedback Shift Register). A shift register is as follows: A number of flip-flops are arranged in a line and the input and output of the neighboring flip-flops are connected with each other so as to be capable of reading the neighboring data. In addition, the LFSR is constructed to apply a feedback to the shift register by an operation circuit including an EXOR gate. There is an advantageous point that the entire circuit scale may be reduced when this LFSR is employed as the counter.

In the counter employing the LFSR, when a code of a state provided by the counter is considered as a vector, a code conversion to the next state may be considered as a linear map, which may be expressed by a matrix. This matrix is called expression matrix. Where the expression matrix is denoted by A (n×n matrix), a code of a current state is denoted by s (n-th vector), and a code of the next state s' (n-th vector), these are expressed by the following relationship:

$$s' = A \cdot s \tag{1}$$

The expression matrix A of this case is expressed by the following formula (2):

$$A = \begin{pmatrix} 0 & 1 & 0 & \cdots & 0 & 0 \\ & 0 & 1 & \cdots & 0 & 0 \\ \cdots & \cdots & \cdots & & \cdots & \cdots \\ 0 & 0 & 0 & \cdots & 1 & 0 \\ 0 & 0 & 0 & \cdots & 0 & 1 \\ a_n & a_{n-1} & a_{n-2} & \cdots & a_2 & a_1 \end{pmatrix} \tag{2}$$

A cycle of the counter corresponding to the expression matrix A is the minimum natural number m satisfying the following formula (3)

$$(A^m) \cdot s = s \tag{3}$$

It is known that the cycle of the expression matrix A is determined by its characteristic polynominal. When a cycle of one characteristic polynominal is the same as that of another, these characteristic polynominals are not always the same as each other. However, when one characteristic polynominal are the same as another, the cycles of these expression matrices are the same as each other. Note that the characteristic polynominal of the matrix A expressed by the formula (2) is $\Phi(x) = x^n - a_1 x^{(n-1)} - \ldots - a_{n-1} x - a_n$.

Further, by way of example, a conventional synchronous counter of FIG. 5 will be described below. This employs an LFSR of n=8. In FIG. 5, F9–F16 each denote a flip-flop; and E8–E10 each denote a 2-input EXOR gate. The outputs of the flip-flops F9–F15 are connected to the inputs of the flip-flops F10–F16, respectively. In addition, the outputs of the flip-flops F12 and F13 are connected to the inputs of the EXOR gate E9, and the outputs of the flip-flops F14 and F16 are connected to the inputs of the EXOR gate E10. Further, the outputs of the EXOR gates E9 and E10 are connected to the inputs of the EXOR gate E8, and the output of the EXOR gate E8 is connected to the input of the flip-flop F9.

The operation will be next described below.

Now, when the states of the flip-flops F16–F9 are respectively provided by (00000001) in a sequence of binary numbers, the next states of the flip-flops F16–F9 are transferred to (00000010), and the states after next thereof (00000100), respectively. The states of the flip-flops F16–F9 come back to (00000001) again after 255 clocks. Accordingly, the counter corresponds to a 255 counter.

Since the conventional synchronous counter by the LFSR is constructed as described above, it must employ the number of EXOR gates corresponding to the number of terms except the highest order of a characteristic polynominal. There is a problem that when the number of the terms is too large, the longest path which connects the output of one flip-flop with the input of another flip-flop, i.e. critical path, is lengthened.

For example, in the counter as shown in FIG. 5, the path from the output of the flip-flop F12 to the input of the flip-flop F9 corresponds to the critical path, of which the length corresponds to two stages of 2-input EXOR gates.

SUMMARY OF THE INVENTION

The present invention is implemented to solve the foregoing problems. It is therefor an object of the present invention to provide a synchronous counter having a short critical path with high speed and small scale.

According to a first aspect of the present invention, there is provided a synchronous counter comprising: at least three or more storage elements having a chain structure; and at least two or more 2-input logic gates interposed in the chain structure, wherein the number of stages of gates interposed between the output of one among the storage elements and the input of another among the storage elements is one stage of a 2-input logic gate even in the longest path.

According to a second aspect of the present invention, there is provided a synchronous counter comprising: a first storage element in which a first signal and a second signal are set to binary values via a set line and a control line, respectively; at least two or more second storage elements capable of setting the second signal to one value via the control line; and at least two or more 2-input logic gates interposed in a chain structure constructed by the first and second storage elements, wherein the number of stages of gates interposed between the output of one among the first and second storage elements and the input of another among the first and second storage elements is one stage of a 2-input logic gate even in the longest path.

Here, the 2-input logic may be constructed by a 2-input EXOR gate.

DETAILED DESCRIPTION OF THE PREFERRED EMBODIMENTS

Embodiments of the present invention are described below.

Embodiment 1

Figure 1:
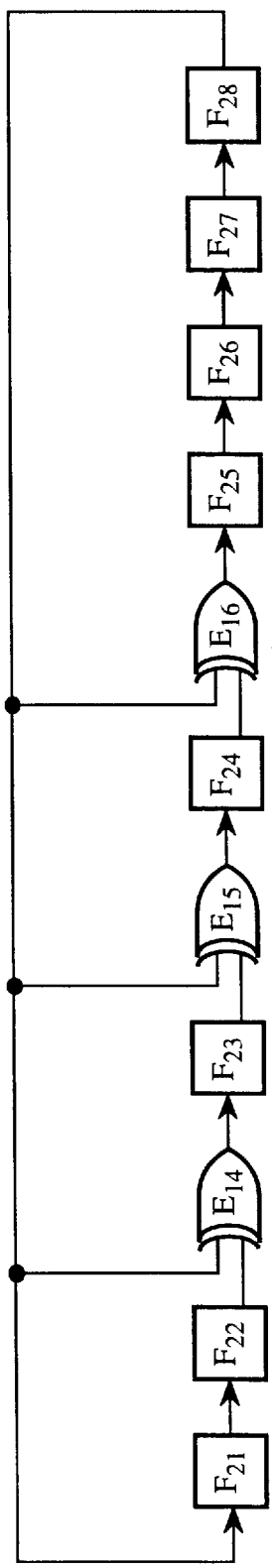
FIG. 1 is a circuit diagram illustrating a synchronous counter in accordance with an embodiment 1 of the present invention.

FIG. 1 is a circuit diagram illustrating a synchronous counter in accordance with an embodiment 1 of the present invention, which corresponds to a mapping of a transposed expression matrix $^tA$ as depicted later. In FIG. 1, F21–F28 each denote a flip-flop (storage element); and E14–E16 each denote an EXOR gate of a 2-input logic gate (logic gate).

The outputs of the flip-flops F21, F25–F27, and F28 are connected to the outputs of the flip-flops F22, F26–F28, and F21, respectively, and the outputs of the flip-flops F22 and F28 are connected to the inputs of the EXOR gate E14. In addition, the outputs of the flip-flips F23 and F28 are connected to the inputs of the EXOR gate E15, the outputs of the flip-flops F24 and F28 are connected to the inputs of the EXOR gate E16, and the outputs of the EXOR gates E14–E16 are connected to the inputs of the flip-flops F23–F25, respectively.

Here, the following viewpoint should be considered:

when one characteristic polynominal of an expression matrix is the same as that of another matrix, the cycles of the counters corresponding to these matrices are the same as each other; accordingly, when among the matrices having the same characteristic formula, the matrix that the factors except zero in each row is fewer is selected, the critical path of circuits can be shortened.

Thus, the matrix $^tA$ of the expression matrix A in the above-depicted formula (2) will be now considered. Even when a matrix is transposed, its characteristic polynominal is not changed; accordingly, the cycle of the counter corresponding to the matrix $^tA$ comes to be equal to that corresponding to the expression matrix A.

The transposed matrix $^tA$ is described in the following formula (4):

$$^tA = \begin{pmatrix} 0 & 0 & \cdots & 0 & 0 & a_n \\ 1 & 0 & \cdots & 0 & 0 & a_{n-1} \\ 0 & 1 & \cdots & 0 & 0 & a_{n-2} \\ \cdots & \cdots & & \cdots & \cdots & \cdots \\ 0 & 0 & \cdots & 1 & 0 & a_2 \\ 0 & 0 & \cdots & 0 & 1 & a_1 \end{pmatrix} \quad (4)$$

Figure 2:
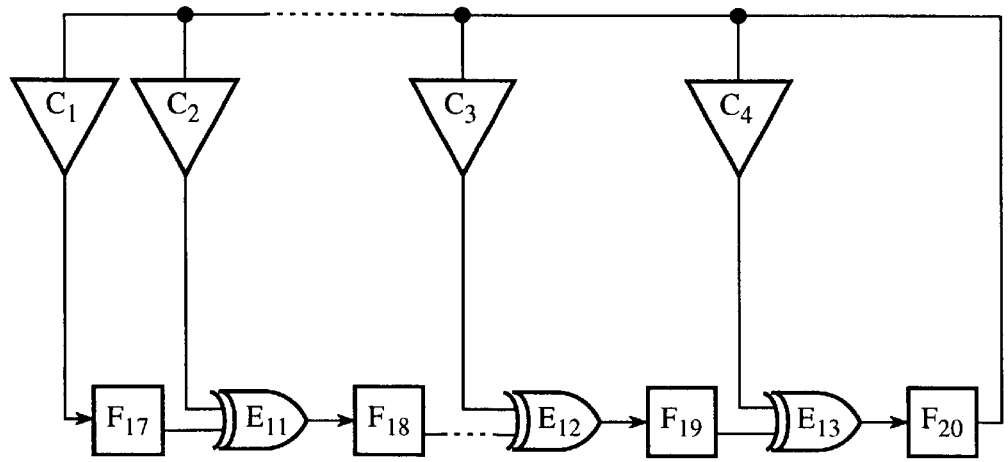
FIG. 2 is a circuit diagram illustrating a typical type of the synchronous counter in accordance with the embodiment 1 of the present invention.

FIG. 2 illustrates the typical type of a synchronous counter corresponding to the transposed matrix $^tA$. In FIG. 2, F17–F20 each denote a flip-flop; E11–E13 each denote an EXOR gate; C1–C4 each denote a constant multiplier; and the constants of the C1, C2, C3, and C4 in the characteristic polynominal of the matrix A correspond to $a_n$, $a_{n-1}$, $a_2$, and $a_1$, respectively. In such a way, when the expression matrix A is transposed to be the expression matrix $^tA$, the factors except zero in each row of the expression matrix $^tA$ are reduced to two at most. This enables the critical path of the counter to be brought to one stage of 2-input EXOR gate.

Figure 5:
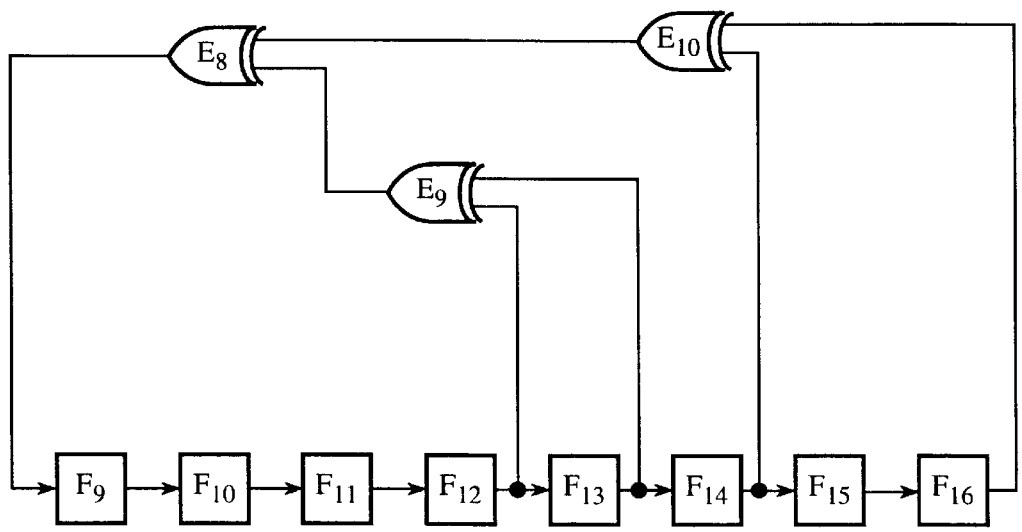
FIG. 5 is a circuit diagram illustrating a conventional synchronous counter with an LFSR.
Figure 4:
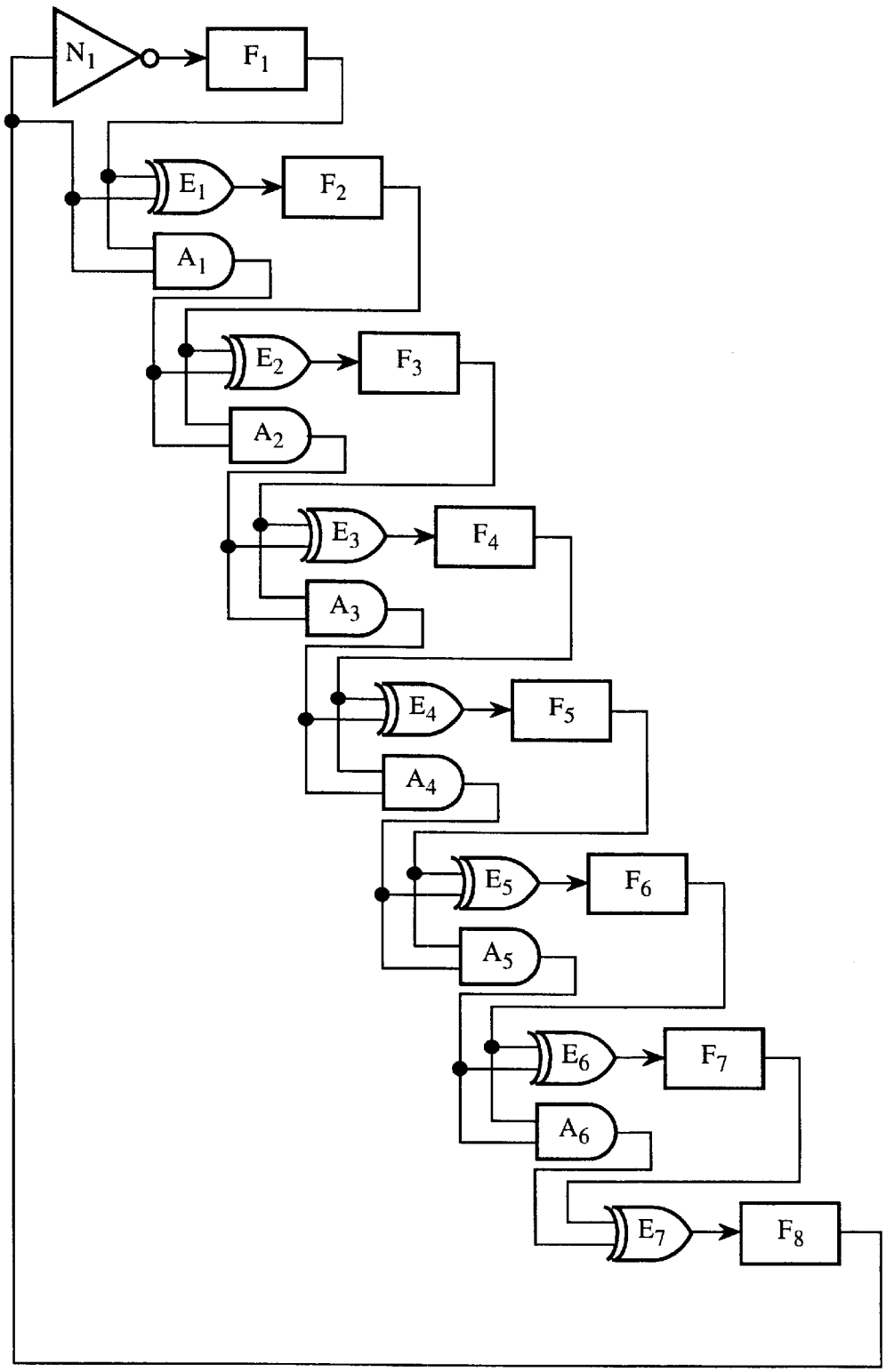
FIG. 4 is a circuit diagram illustrating a binary counter as a typical counter in the prior art.

When the conventional synchronous counter as shown in FIG. 5 is considered, this counter employs an LFSR of n=8. Assuming that the states of the flip-flops F16–F9 are provided with (00000001) in a sequence of binary numbers, the next states are transferred to (00000010), and the states after next (00000100), respectively. The states of the flip-flops F16–F9 come back to the state (00000001) again after 255 clocks. Accordingly, this synchronous counter is a 255 counter.

The expression matrix A which designates a mapping of this counter is expressed in the following formula (5):

$$A = \begin{pmatrix} 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 1 & 1 & 1 & 0 & 0 & 0 \end{pmatrix} \quad (5)$$

This is a companion matrix which have a characteristic polynominal of $\Phi(x)=x^8+x^4+x^3+x^2+1$. Since four among the factors except zero are included in the eighth row of the expression matrix A, the critical path of the synchronous counter is constructed by two stages of 2-input EXOR gate.

Here, when the expression matrix $^tA$ transposing the expression matrix A is considered, it is provided with the following formula (6):

$$
{}^tA = \begin{pmatrix} 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 1 \\ 0 & 0 & 1 & 0 & 0 & 0 & 0 & 1 \\ 0 & 0 & 0 & 1 & 0 & 0 & 0 & 1 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{pmatrix} \quad (6)
$$

Even when the matrix is transposed, the characteristic polynominal of the transposed matrix is not changed. Accordingly, the characteristic polynominal of the transposed matrix ${}^tA$ is also $\Phi(x)=x^8+x^4+x^3+x^2+1$. Therefore, the cycle of the counter corresponding to a mapping having the matrix ${}^tA$ as an expression matrix is also 255 as well as the matrix A. In other words, the synchronous counter corresponding to the mapping in which the expression matrix is ${}^tA$ corresponds to the circuit of FIG. 1.

The operation will be next described below.

When the states of the flip-flops F21–F28 are now provided with (10000000) in a sequence of binary numbers, respectively, the next states are transferred to (01000000), and the states after next (00100000), respectively. Accordingly, the states of the flip-flops F21–F28 come back to (10000000) again after 255 clocks. Accordingly, this counter corresponds to a 255 counter. Then, since each row of the matrix ${}^tA$ has at most two of the factors except zero, the critical path of the synchronous counter may be constructed by one stage of 2-input EXOR gate. This results in being shorter than the two stages of 2-input EXOR gate before transposing of the matrix A.

As described above, according to the embodiment 1, a synchronous counter is constructed as follows: Three or more storage elements are arranged in a chain structure, two or more 2-input EXOR gates are interposed among the storage elements, and the number of stages of logic gates interposed between the output of one storage element and the input of another storage element is one stage of a 2-input EXOR gate even in the critical path. In such a way, a synchronous counter with high speed and small scale may be achieved.

Embodiment 2

Figure 3:
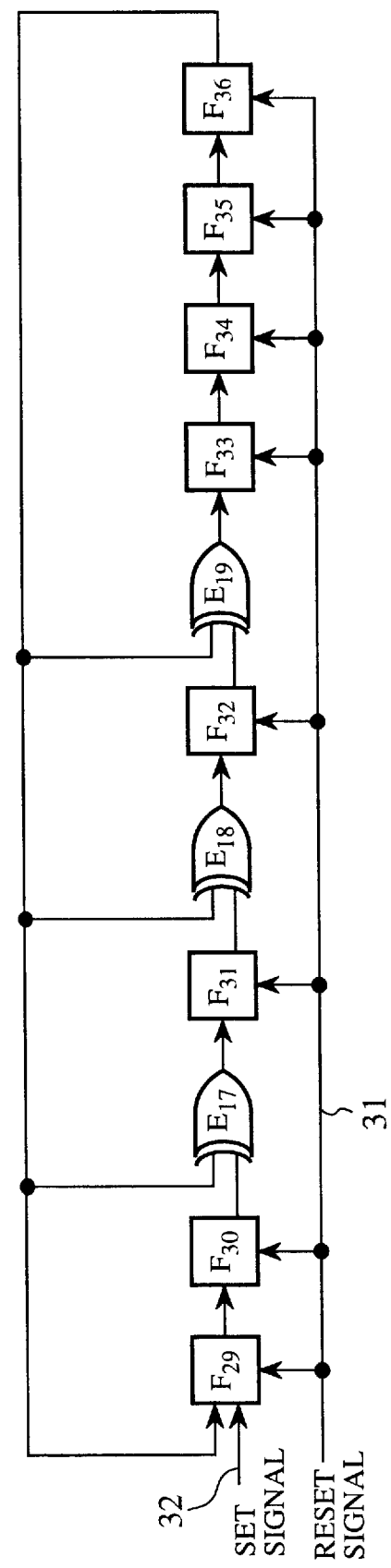
FIG. 3 is a circuit diagram illustrating a synchronous counter changeable to a stand-by operation in accordance with an embodiment 2 of the present invention.

FIG. 3 is a circuit diagram illustrating a synchronous counter in accordance with an embodiment 2 of the present invention, and a counter employing an LFSR of n=8. In FIG. 3, F29 denotes a flip-flop with set and reset functions (first storage element); F30–F36 each denote a flip-flop with a reset function (second storage element); E17–E19 each denote an EXOR gate of a 2-input logic gate; 31 designates a control line; and 32 designates a set line.

Here, the outputs of the flip-flops F29, F33–F35, and F36 are connected to the inputs of the flip-flops F30, F34–F36, and F29, and the outputs of the flip-flops F30 and F36 are connected to the inputs of the EXOR gate E17. The outputs of the flip-flops F31 and F36 are connected to the inputs of the EXOR gate E18, the outputs of the flip-flops F32 and F36 are connected to the inputs of the EXOR gate E19, and further the outputs of the EXOR gates E17–E19 are connected to the inputs of the flip-flops F31–F33, respectively. A set signal is inputted to the flip-flop F29 via the set line 32, while a reset signal is inputted to all the flip-flops F29–F36 via the control line 31.

The operation will be next described below.

When both the set and reset signals are "L" level, and the states of the flip-flops F29–F36 are respectively provided with, e.g., (10000000) except (00000000) in a sequence of binary numbers, the next states of the flip-flops F29–F36 are transformed to (01000000), and the states of next thereof (00100000), respectively. Such a procedure takes certain states different from (10000000) till after 254 clocks, and performs an operation of a 255 counter such that the states of the flip-flops F29–F36 come back to (10000000) only after 255 clocks.

However, when "H" level is inputted to the reset signal, and the states of the flip-flops F29–F36 become (00000000) in a sequence of binary numbers, respectively, the next states also become (00000000), which results in a standby operation instead of the counter operation. This standby operation is maintained till "L" level is inputted to the reset signal and "H" level inputted to the set signal, simultaneously. In the meantime, the standby state is maintained even when the reset signal is either of "L" and "H" levels. A switching operation of transistors is not activated during the standby operation, which serves as a low power consumption mode.

Note that the transition from the standby operation to the normal counter operation may be performed by bringing the states of the flip-flops F29–F36 to (10000000), respectively, while "L" and "H" levels are inputted as the reset and set signals, respectively.

As described above, according to the embodiment 2, a synchronous counter is constructed as follows: the flip-flops capable of setting the set and reset signals via the set and control lines, respectively, and the flip-flops capable of setting the reset signal via the control line are arranged in a chain structure; two or more 2-input EXOR gates are interposed between the chain structure; the number of stages of logic gates interposed between the output of one storage element and the input of another storage element is one stage of a 2-input EXOR gate even in the critical path.

In such a way, the synchronous counter may take a standby state in which a value of the counter is not changed even when the clock goes ahead; since the control line for a transition to the standby state is connected to all the flip-flops, the counter may be transited to the standby state if a signal for designating the transition to the standby state is inputted to the control line; thereafter, even when another control signal is not inputted to the control line, the standby state may be maintained till a signal for a transition to the counter state is inputted thereto.

Therefore, the aforementioned synchronous counter with high speed and small scale may be achieved, and further a low power consumption mode may be achieved since the switching operation of the transistors is not activated.

According to the embodiments 1 and 2, the 2-input EXOR gate as a logic gate is represented as an example, which is not limited to, the same constructions and effects may be obtained by other logic gates having at least 2 or more-inputs.

What is claimed is:

1. A synchronous counter comprising:
at least three or more storage elements having a chain structure, wherein an output of a last storage element in said chain structure is connected to an input of a first storage element in said chain structure; and
at least two or more 2-input logic gates interposed in said chain structure, wherein said 2-input logic is constructed by a 2-input EXOR gate,
wherein a number of stages of gates interposed between an output of one among said storage elements and an input of another among said storage elements is one stage of a 2-input logic gate even in a critical path.

2. A synchronous counter comprising:

a first storage element in which a first signal and a second signal are input as binary values via a set line and a control line, respectively;

at least two or more second storage elements in a chain structure with said first storage element and capable of setting an output signal of one among said first and second storage elements to a certain value via said control line; and at least two or more 2-input logic gates interposed in the chain structure constructed by said second storage elements, wherein a number of stages of gates interposed between the output of one among said second storage elements and an input of another among said second storage elements is one stage of a 2-input logic gate even in a critical path.

3. The synchronous counter according to claim 2, wherein said 2-input logic is constructed by a 2-input EXOR gate.

4. A synchronous counter comprising:

a first storage element in which a first signal is set to a binary value;

at least two or more second storage elements in a chain structure with said first storage element; and at least two or more 2-input logic gates interposed between said second storage elements, wherein said 2-input logic is constructed by a 2-input EXOR gate, wherein a number of stages of gates interposed between an output of one among said second storage elements and an input of another among said second storage elements is one stage of a 2-input logic gate even in a critical path.

* * * * *